United States Patent [19]

Thakur et al.

[11] Patent Number: 4,698,121
[45] Date of Patent: * Oct. 6, 1987

[54] METHODS FOR THE PREPARATION OF ORIENTED THIN LARGE-AREA SINGLE CRYSTALS OF DIACETYLENES AND POLYDIACETYLENES

[75] Inventors: Mrinal K. Thakur, Waltham; Sukant K. Tripathy, Arlington; Daniel J. Sandman, Acton, all of Mass.

[73] Assignee: GTE Laboratories Incorporated, Waltham, Mass.

[ * ] Notice: The portion of the term of this patent subsequent to Aug. 4, 2004 has been disclaimed.

[21] Appl. No.: 705,586

[22] Filed: Feb. 26, 1985

[51] Int. Cl.$^4$ ............... C30G 1/12; C30G 29/54; C30G 29/58
[52] U.S. Cl. .................. 156/622; 156/624; 156/DIG. 113; 427/35; 427/44
[58] Field of Search ............ 156/622, 624, DIG. 113, 156/621, 273.7; 562/598, 600; 560/855, 873, 856; 522/3, 173, 174, 180, 179, 182; 427/35, 44; 526/240, 285; 260/456 P

[56] References Cited

U.S. PATENT DOCUMENTS

| | | | |
|---|---|---|---|
| 4,215,208 | 7/1980 | Yee et al. | 526/285 |
| 4,220,747 | 9/1980 | Preziosi et al. | 526/285 |
| 4,235,108 | 11/1980 | Patel | 522/174 |
| 4,238,352 | 12/1980 | Patel | 522/174 |
| 4,562,141 | 12/1985 | Tieke | 526/285 |

FOREIGN PATENT DOCUMENTS 106624  8/1981  Japan ........................... 156/621

OTHER PUBLICATIONS

Bloor et al, Chemical Physics Letters, vol. 24, No. 3, 2/1/74, pp. 407–411.
Rickert et al, Mol. Cryst Liq. Cryst., 1983, vol. 93, pp. 307–314.
Casalnuovo et al, Makromol. Chem., Rapid Commun., 5, pp. 77–81, (1984).
Balik et al, J. Pol. Sci., 20, pp. 2003–2016 (1982).
Thakur et al, Growth of Large Area Thin Film Single Crystals of Poly(diacetylenes), Macromolecules, vol. 18, pp. 2341–2344, Nov. 85.
Thakur et al, Presentation: Optical Properties of a New Phase of PolyTCDU, APS Meeting, 3/27/84, Gordon Conference, 7/3/84–abstract.
Collan, Cryogenics, Jun. 1969, p. 215.

*Primary Examiner*—Gary P. Straub
*Attorney, Agent, or Firm*—Martha A. Finnegan; Frances P. Craig

[57] ABSTRACT

Methods for preparing thin large-area single crystals of diacetylenes and polydiacetylenes having surface dimensions greater than or equal to about 0.1 mm on all sides and a uniform thickness less than or equal to about 100 microns. The methods involve forming a liquid layer, preferably by melting crystals of a pure diacetylene monomer between two opposed surfaces, one surface being movable with respect to the other; applying pressure to the molten monomer layer disposed between the two surfaces; shearing the molten layer by sliding the movable surface in a single direction that is in a straight line across the molten monomer layer while keeping the molten monomer layer under constant pressure; and crystallizing the shorn molten monomer layer while the shorn molten monomer layer is kept under constant pressure to form a thin large-area single crystal of pure diacetylene monomer. The method for preparing thin large-area single crystals of polydiacetylene further involves exposing a surface of the thin large-area single crystal of diacetylene monomer to ultraviolet or gamma radiation to form a thin large-area single crystal of polydiacetylene.

12 Claims, No Drawings

METHODS FOR THE PREPARATION OF ORIENTED THIN LARGE-AREA SINGLE CRYSTALS OF DIACETYLENES AND POLYDIACETYLENES

CROSS REFERENCE TO RELATED APPLICATION

U.S. patent application Ser. No. 705,587 by Thakur, Tripathy, and Sandman filed on even date herewith for Methods for the Preparation of Thin Large-Area Single Crystals of Diacetylenes and Polydiacetylenes.

BACKGROUND OF THE INVENTION

This invention relates to diacetylenes and polymers thereof. More particularly, it relates to large-area thin single crystal films of diacetylenes and polymers thereof.

Polydiacetylenes consist of weakly coupled linear parallel chains of conjugated covalently bound carbon atoms. Polydiacetylenes are formed by a solid state reaction of adjacent monomer units in diacetylene single crystals which can be grown by a variety of approaches to achieve macroscopic form. The polymer backbone is usually represented by the acetylenic structure (I)

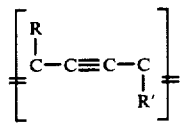

where R and R' are suitably chosen side groups which vary from polymer to polymer. The fully conjugated backbone of the polydiacetylene provides a one-dimensional electronic structure.

Fully crystalline polydiacetylenes have been reported to exhibit carrier mobilities comparable to silicon or gallium arsenide For example, the diacetylene polymer from bis (p-toluene-sulfonate) of 2,4-hexadiyne-1,6-diol (PTS) has been reported to exhibit exceptionally high carrier mobilities along its chain direction, $\mu \sim 20 m^2 s^{-1} v^{-1}$. The long carrier mean free paths implied clearly follow from the full order of these polymers. This class of polymers is of value as nonlinear optical elements, as photoconductors, timetemperature indicators, photoresists, and memories. Polydiacetylenes may also have application in all optical signal processing due to the very high values of their third-order nonlinear susceptibilities $\chi^3(\omega)$.

The predominant physical form required for the various optical, electrical, or electronic applications for polydiacetylenes is that of a uniformly thin ($\leqq 100$ microns) large area (>0.1 mm on all sides) single crystal. Prior to the method of the present invention and the invention disclosed in U.S. patent application Ser. No. 705,587 by M. K. Thakur, S. K. Tripathy, and D. J. Sandman entitled "Methods for the Preparation of Thin Large-Area Single Crystals of Diacetylenes and Polydiacetylenes," filed concurrently herewith, no systematic technique has been reported that would produce uniformly thin large-area single crystals of polydiacetylenes having such dimensions, nor has the existence of optical quality thin large-area single crystals of polydiacetylene been previously reported Conventional approaches of crystallization, such as the method reported in U.S. Pat. No. 4,220,747, issued to A. F. Preziosi et al. on Sept. 2 1980, result in crystals of uncontrollable dimensions, beset with macroscopic flaws and surface defects. Accordingly, the crystals prepared by known methods are not suitable for most existing and envisaged optical, electrical, or electronic applications. Crystal growth techniques for preparing single crystals of various inorganic materials or small organic molecules have not been successfully used to grow uniformly thin ($\leqq 100$ microns) optical quality large size crystals of organic polymers. Epitaxial methods, or the methods for lattice matching, originally developed for crystallization of inorganic solids, has also been tried for organic polymeric materials such as polyethylene, polyoxymethylene, and polydiacetylenes. These efforts have not, however, been successful to prepare uniformly thin ( <100 microns) macroscopic single crystals of polydiacetylene. Polydiacetylene crystals grown by epitaxial methods, as reported by S. E. Rickert et al in Mol Cryst and Liq. Cryst. 96, 307 (1983), are only of microscopic size, $\simeq 1$ micron$\times 1$ micron$\times 200$ angstroms.

SUMMARY OF THE INVENTION

In accordance with the present invention, there is provided a method for preparing thin large-area single crystals of diacetylene monomer comprising: melting crystals of pure diacetylene monomer represented by the formula

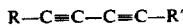

wherein R and R' are side groups selected such that the diacetylene monomer is polymerizable by a 1,4-addition solid state reaction upon exposure to actinic radiation between two opposed surfaces, one surface, being movable with respect to the other surface, to form a molten monomer layer; applying pressure of at least about 5 psi (0.4 kg. cm$^{-2}$) to the molten monomer layer disposed between the two opposed surfaces; shearing the molten monomer layer by sliding the movable surface in a single direction across the molten monomer layer while keeping the molten monomer layer under constant pressure; and crystallizing the shorn molten monomer layer, while the shorn molten layer is kept under constant pressure, to form a thin large-area single crystal of diacetylene monomer.

In accordance with another aspect of the present invention, there is provided a thin large-area single crystal of diacetylene monomer represented by the formula

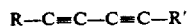

wherein R and R' are side groups selected such that the diacetylene monomer is polymerizable by a 1,4-addition solid state reaction upon exposure to actinic radiation.

In accordance with still another aspect of the present invention, there is provided a method for preparing thin large-area single crystals of polydiacetylene of the present invention comprising: melting crystals of pure diacetylene monomer represented by the formula

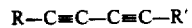

wherein R and R' are side groups selected such that the diacetylene monomer is polymerizable by a 1,4-addition solid state reaction upon exposure to actinic radiation between two opposed surfaces, one surface being movable with respect to the other, to form a molten monomer layer; applying pressure of at least about 5 psi (0.4 kg. cm$^{-2}$) to the molten monomer layer disposed between the two opposed surfaces; shearing the molten monomer by sliding the movable surface in a single direction across the monomer layer while keeping the molten monomer layer under constant pressure; crystallizing the shorn molten monomer layer while keeping the shorn molten monomer layer under constant pressure to form a thin large-area single crystal of diacetylene monomer; and exposing the thin large-area crystal of diacetylene monomer to actinic radiation, e.g., ultraviolet or gamma radiation, to form a thin large-area crystal of polydiacetylene.

In accordance with yet another aspect of the present invention, there is provided a thin large-area single crystal of polydiacetylene prepared by exposing a thin large area single crystal of diacetylene monomer to actinic radiation, the diacetylene monomer being represented by the formula

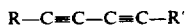

wherein R and R′ are side groups selected such that the diacetylene monomer is polymerizable by a 1,4-addition solid state reaction upon exposure to actinic radiation.

A "thin large-area single crystal" of diacetylene monomer or polydiacetylene in accordance with the present invention has two flat planar opposed major parallel faces with surface dimensions greater than or equal to about 0.1 mm on all sides and a uniform thickness less than or equal to about 100 microns. The diacetylene monomer and polydiacetylene crystals of the present invention preferably have a uniform thickness less than or equal to about 10 microns and most preferably less than or equal to about 1 micron but greater than or equal to about 0.5 micron.

DETAILED DESCRIPTION OF THE INVENTION

In accordance with the present invention, there are provided uniformly thin large-area single crystals of diacetylene monomer represented by the general formula

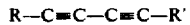

wherein R and R′ are side groups selected such that the diacetylene monomer is polymerizable by a 1,4-addition solid state reaction upon exposure to actinic radiation.

In order for a diacetylene monomer to be polymerizable by solid state polymerization of the monomer, the diacetylene monomer must exhibit suitable molecular packing parameters. More specifically, in order for the diacetylene monomer to be solid-state polymerizable, neighboring monomer molecules should be separated by a stacking distance, or center to center vector, which is in the range of 3.8 to 8.3 Angstroms and preferably in the range 4.4 to 6.8 Angstroms. Additionally, the inclination of the rods of the diacetylene groups in these neighboring molecules with respect to the stacking axis, or vector, must be in the range 24°–65°, and preferably in the range of 30° to 51°. Maximal reactivity is expected for a stacking distance, or vector, of about 5 Angstroms and an angle of about 45°. Solid-state reactivity is controlled by the monomer packing, rather than by the chemical nature of the R and R′ substituents of the monomer molecule. See V. Enkelmann, "Structural Aspects of the Topochemical Polymerization of Diacetylenes", Advances in Polymer Science: Polydiacetylenes, Springer-Verlag, Berlin Heidelberg 1984, PP 91–136, and U.S. Pat. No. 4,220,747 issued to Preziosi et al. on Sept. 2, 1980 for "Crystalline Diacetylene Polymers", which are incorporated herein by reference.

Examples of suitably chosen R-R′ pairs include:

R=—CH$_2$OSO$_2$C$_6$H$_4$CH$_3$ and R′=—CH$_2$OSO$_2$C$_6$H$_4$CH$_3$;

R=—CH$_2$OCONHC$_6$H$_5$ and R′=CH$_2$OCONHC$_6$H$_5$;

R=—(CH$_2$)$_3$OCONHC$_6$H$_5$ and R′=—(CH$_2$)$_3$OCONHC$_6$H$_5$;

R=—(CH$_2$)$_4$OCONHC$_6$H$_5$ and R′=—(CH$_2$)$_4$OCONHC$_6$H$_5$;

R=—(CH$_2$)$_4$OCONHC$_2$H$_5$ and R′=(CH$_2$)$_4$OCONHC$_2$H$_5$;

R=(CH$_2$)$_4$OCONHCH(CH$_3$)$_2$ and R′=—(CH$_2$)$_4$OCONHCH(CH$_3$)$_2$;

R′=—(CH$_2$)$_n$OCONHCH$_2$COOZ and R′=—(CH$_2$)$_n$OCONHCH$_2$COOZ, wherein Z is an alkyl or aryl group;

R=—CH$_2$NC$_{12}$H$_8$ and R′=—CH$_2$NC$_{12}$H$_8$;

R=—(CH$_2$)$_2$OH and R′=—(CH$_2$)$_2$OH;

R=—(CH$_2$)$_3$OH and R′=—(CH$_2$)$_3$OH;

R=—(CH$_2$)$_8$COOCH$_3$ and R′=—(CH$_2$)$_8$COOCH$_3$

R=—CH$_2$OH and R′=CH$_3$;

R=—(CH$_2$)$_n$CH$_3$ and R′=—(CH$_2$)$_m$COOH, wherein 12<n<16, 1<m<10, and n and m are difference integers; and R=—(CH$_2$)$_n$CH$_3$ and R =—(CH$_2$)$_m$COO—Li$^+$, wherein 12<n<16, 1<m<10, and n and m are different integers.

As used herein, "thin large-area single crystal" is used to mean a single crystal having two flat planar opposed major parallel faces with surface dimensions greater than or equal to about 0.1 mm on all sides and a uniform thickness less than or equal to about 100

In the method of the present invention for preparing the uniformly thin large-area single crystals of diacetylene monomer, crystals of pure diacetylene monomer represented by the general formula

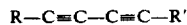

wherein R and R′ are side groups selected such that the diacetylene monomer is polymerizable by a 1,4-addition solid state reaction upon exposure to actinic radiation are heated between two opposed surfaces to a temperature sufficiently high to completely melt the crystals, thereby forming a molten monomer layer. One of the two opposed surfaces between which the pure monomer is melted must be movable with respect to the other. Pressure of at least about 5 psi (0.4 kg-cm$^{-2}$) is applied to the molten monomer layer disposed between the two opposed surfaces, and the molten liquid layer is then sheared by longitudinally sliding the movable surface across the molten monomer layer in a single direction, parallel to the other of the two opposed surfaces, while keeping the molten monomer layer under constant pressure. The shorn molten monomer layer is crystallized by cooling the shorn molten monomer layer at a cooling rate less than or equal to about 0.1° C./minute. Constant pressure is maintained on the monomer layer during cooling to form a thin large area single crystal film of pure diacetylene monomer. Preferably the cooling rate is less than or equal to about 1° C./hour, and most preferably less than or equal to 0.5°

C./hour. The growth direction of the resulting film is determined by the direction of the shear across the molten layer and the thickness is controlled by both the proximity of the surfaces and/or the pressure applied. The thickness of the crystals can be reduced by decreasing the distance between the two opposed surfaces and/or by increasing the pressure. Diacetylene monomer crystals prepared in accordance with the present invention are prepared in an inert atmosphere.

The thin large-area single crystals of diacetylene monomers prepared in accordance with the present invention are essentially free of flaws and surface defects, and consequently, can be described as having optical quality.

In order for diacetylene monomer material to be suitable for use in preparing uniformly thin large-area single crystals of optical quality, the starting material must be pure, i.e., free of any polymerized particles and other impurities. Diacetylene monomers tend to polymerize partially upon exposure to ordinary light at room temperature. Diacetylene monomer should be stored preferably in solution at low temperature in the dark. Best results are obtained if the monomer materials are first purified and crystallized following conventional approaches in a clean room (class 100) condition under red light; and if the present method steps are also carried out in clean room (class 100) conditions under red light. The diacetylene monomer starting material should be selected to have the R and R' side groups of the desired product.

The two opposed surfaces between which the thin large-area single crystals of the present invention are formed must be flat, smooth, parallel surfaces.

Scrupulous cleanliness of the two opposed surfaces between which the selected monomer crystals are melted must be maintained throughout the preparation process to avoid undesired nucleation during the growth process. Examples of types of materials suitable for use as surfaces in preparing the crystals of the present invention are glasses, quartz, inorganic salt crystals, and metals. The two substrates being used to form the two opposed surfaces need not be made of similar types of materials. For example, glass - salt, glass - metal, and salt - metal substrate pairs function equally as well as glass - glass, quartz - quartz, salt - salt, and metal - metal substrate pairs.

The pressure applied to the molten diacetylene monomer layer and maintained during the shearing step and subsequent crystallization step should be greater than or equal to about 5 psi (0.4 kg. cm$^{-2}$). Preferably, the amount of pressure applied and maintained is approximately 200 psi (14 kg. cm$^{-2}$). And, again, all method steps are conducted in an inert atmosphere, such as argon, for example.

In the method of the present invention for preparing uniformly thin large-area single crystals of polydiacetylene, crystals of pure diacetylene monomer represented by the general formula

$$R-C\equiv C-C\equiv C-R'$$

wherein R and R' are side groups selected such that the diacetylene monomer is polymerizable by a 1,4-addition solid state reaction upon exposure to actinic radiation are heated between two opposed surfaces to a temperature sufficiently high to completely melt the crystals, thereby forming a molten monomer layer. One of the two opposed surfaces between which the pure monomer is melted must be movable with respect to the other. Pressure of at least about 5 psi (0.4 kg-cm$^{-2}$) is applied to the molten monomer layer disposed between the two opposed surfaces, and the molten liquid layer is then sheared by longitudinally sliding the movable surface across the molten monomer layer in a single direction, parallel to the other of the two opposed surfaces, while keeping the molten monomer layer under constant pressure. The shorn molten monomer layer is crystallized by cooling the shorn molten monomer layer at a cooling rate less than or equal to about 0.1° C./minute. Constant pressure is maintained on the monomer layer during cooling to form a thin large area single crystal film of pure diacetylene monomer. Preferably the cooling rate is less than or equal to about 1° C./hour, and most preferably less than or equal to 0.5° C./hour. The growth direction of the resulting film is determined by the direction of the shear across the molten layer and the thickness is controlled by both the proximity of the surfaces and/or the pressure applied. The thickness of the crystals can be reduced by decreasing the distance between the two opposed surfaces and/or by increasing the pressure. Polydiacetylene crystals prepared in accordance with the present method are prepared in an inert atmosphere.

The uniformly thin large-area single crystals of the diacetylene monomer are finally treated with ultraviolet or gamma radiation by exposing a surface of the monomer crystal to the radiation to polymerize the diacetylene monomer in its uniformly thin large-area single crystal form to produce uniformly thin large-area single crystals of the respective polydiacetylene. The polydiacetylene crystals of the present invention possess optical quality, i.e., the crystals are suitable for optical applications. These crystals are essentially free of flaws and surface defects.

In order for diacetylene monomer material to be suitable for use in preparing uniformly thin large-area single crystals of polydiacetylenes which possess optical quality, the starting monomer material must be pure, i.e., free of any polymerized particles and other impurities. Because diacetylene monomers tend to polymerize partially upon exposure to ordinary light at room temperature, the diacetylene monomer should be stored preferably in solution at low temperature in the dark. Best results are obtained if the monomer materials are first purified and crystallized following conventional approaches in a clean room (class 100) condition under red light; and if the present method steps are also performed in clean room (class 100) conditions under red light. The diacetylene monomer starting material should be selected to have the R and R' side groups of the desired polydiacetylene product.

The two opposed surfaces between which the thin large-area single crystals of the present invention are formed must be flat, smooth, parallel surfaces.

Scrupulous cleanliness of the two opposed surfaces between which the selected monomer crystals are melted must be maintained throughout the preparation process to avoid undesired nucleation during the growth process. Examples of types of materials suitable for use as surfaces in preparing the crystals of the present invention are glasses, quartz, inorganic salt crystals, and metals. The two substrates being used to form the two opposed surfaces need not be made of similar types of materials. For example, glass - salt, glass - metal, and salt - metal substrate pairs function equally as well as glass - glass, quartz - quartz, salt - salt, and metal - metal substrate pairs.

The pressure applied to the molten diacetylene monomer layer and maintained during the shearing step and subsequent crystallization step should be greater than or equal to about 5 psi (0.4 kg. cm$^{-2}$). Preferably, the amount of pressure applied and maintained is approximately 200 psi (14 kg. cm$^{-2}$). And, again, all method steps are conducted in an inert atmosphere, such as argon, for example.

The uniformly thin large-area single crystals of diacetylene monomer of the present invention can be treated with ultraviolet or gamma radiation to polymerize the diacetylene monomer in its uniformly thin large-area single crystal form to produce uniformly thin large area single crystals of the respective polydiacetylene. The polydiacetylene crystals of the present invention possess optical quality, i.e., the crystals are suitable for optical applications. These crystals are essentially free of flaws and surface defects.

The Fourier transform infrared (FTIR) spectrum of shear-grown diacetylene monomer with R=R'=—(CH$_2$)$_3$OCONHC$_6$ (TCDU) is in excellent agreement with the spectrum of polycrystalline TCDU monomer powder, indicating no detectable decomposition occurs during crystal growth. Further, the FTIR spectrum of poly-TCDU prepared from shear-grown TCDU monomer by ultraviolet (UV) light is in excellent agreement with the spectrum of freestanding poly-TCDU crystal, indicating that solid state polymerization is the only detectable process which the UV light effects.

Very thin, for example, approximately 1 micron and less, perfectly oriented large area single crystal diacetylene films and polydiacetylene films can be obtained using the method of the present invention. An additional advantage offered by this technique is the very short time that is required for completion of the whole process.

An even further advantage of preparing uniformly thin large-area single crystals of polydiacetylenes according to the present invention is that by selecting an appropriate substrate to underlie the thin large area single crystal polydiacetylene film being prepared, the polydiacetylene crystal film and underlying substrate can have application as a waveguide in optical circuits. For this application, the substrate must have a lower refractive index than that of the polydiacetylene crystal. For example, if a silver-coated glass slide is used to form the substrate upon which single polydiacetylene crystal in accordance with the present invention is formed, the silver-coated glass slide with the uniformly thin large area single crystal film of polydiacetylene thereon can function as a waveguide. Silver, being a metal, has a negative refractive index. Accordingly, a silver-coated glass slide is an appropriate substrate for waveguide application. The silver coating for the glass slide should be approximately 1 micron thick. The polydiacetylene single crystal film should be on the order of approximately 0.5 micron thick for the waveguide to operate at wavelengths up to around 8000 Angstroms.

The growth technique of the present invention may be further illustrated with reference to the following examples:

EXAMPLE I

A few crystals of diacetylene monomer with R=R'=—(CH$_2$)$_4$OCONHC$_6$H$_5$ (TCDU), grown from solution (acetone/ethylacetate) using conventional techniques (see U.S. Pat. No. 4,220,747 by Preziosi et al. 1980) were incorporated between two pre-cleaned glass slides. The glass/monomer/glass assembly was placed between two controlled temperature (sensitivity 0.1° C.) symmetric heating plates on a Carver Laboratory Press (Model B) and the temperature was raised to a temperature slightly above the monomer melting point (145° C.). This assembly was subsequently subjected to a pressure (200 psi) and mild shear (by moving one glass slide with respect to the other), while the monomer was at the melt phase. Subsequently, the temperature was reduced slowly, at a rate of 1° C./hour, keeping the pressure constant. Crystallization occurred and resulted in a very thin single crystal film of diacetylene monomer which was studied using Leitz (Laborlux 12 pol) optical microscope under polarization conditions. The crystal was exposed to ultraviolet radiation to solid state polymerize the TCDU monomer. A single crystal film of area 0.5 cm×0.7 cm with thickness 1 micron was observed.

EXAMPLE II

The same procedure as stated in Example I was followed with TCDU monomer in an assembly of glass/monomer/silver coated glass slide The TCDU films, thus obtained on the silver coated glass slide was also of large area ($\simeq$0.6 cm×0.7 cm) and thin ($\simeq$1 micron). The objective of this specific experiment was to fabricate a thin polydiacetylene film on a substrate having a lower refractive index. (See G. M. Carter et al. "Nonlinear Optical Properties of Organic and Polymeric Materials", D. J. Williams, Ed., ACS Symp. Series, 233 (1983)). Silver, being a metal, has effectively a negative refractive index and, therefore, silver coated glass was a suitable choice of substrate for this specific application. The TCDU film was solid state polymerized by exposing the monomer to ultraviolet radiation to produce a similarly dimensioned poly-TCDU crystal film.

EXAMPLE III

The same procedure as stated in Example I was followed using a diacetylene monomer having R=R'=—(CH$_2$)OCONHC$_2$H$_5$ (ETCD) in a quartz/monomer/ quartz assembly. The quartz plates were cleaned and polished before use. The thin film single crystals of ETCD obtained using this method were approximately 1 cm×0.8 cm in area and one micron in thickness.

X-ray electron diffraction, optical absorption spectroscopy, FTIR, and Raman measurements have been performed on the resulting poly-TCDU and poly-ETCD crystals. No change in the chemical bonding was noticed. However, the unit-cell parameters and the optical absorption band edges for these crystals are different from the conventionally grown poly-TCDU and poly-ETCD crystals.

While it has been shown and described what are considered preferred embodiments of the present invention, it will be obvious to those skilled in the art that various changes and modifications may be made therein without departing from the invention as defined by the appended claims.

What is claimed is:

1. A method for preparing thin large area single crystal of diacetylene monomer comprising:

forming a liquid layer of a molten pure diacetylene monomer represented by the formula

wherein R and R' are side groups selected such that the diacetylene monomer is polymerizable by a 1,4-addition solid state reaction upon exposure to actinic radiation between two clean, parallel, flat, smooth, opposed surfaces, one surface being movable with respect to the other surface;

applying pressure of at least 5 psi to the molten monomer layer disposed between the two opposed surfaces;

shearing the molten monomer layer by sliding the movable surface in a single direction across the molten monomer layer, while keeping the molten monomer layer under constant pressure of at least 5 psi; and crystallizing the shorn molten monomer layer by cooling, while maintaining constant pressure on the shorn molten monomer layer, to form a thin large-area single crystal of diacetylene monomer of a single predetermined growth direction;

wherein the steps of forming, applying pressure to, shearing, and crystallizing the molten monomer layer are all carried out in an inert atmosphere.

2. A method in accordance with claim 1 wherein R and R' are selected from the group of R and R' pairs consisting of:

R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'=—(CH$_2$)$_4$OCONHC$_6$H$_5$;
R=—(CH$_2$)$_4$OCONHC$_2$H$_5$ and R'=—(CH$_2$)$_4$OCONHC$_2$H$_5$;
R=(CH$_2$)$_4$OCONHCH(CH$_3$)$_2$ and R'=—(CH$_2$)$_4$OCONHCH(CH$_3$)$_2$;
R=—(CH$_2$)$_n$OCONHCH$_2$COOZ and R'=—(CH$_2$)$_n$OCONHCH$_2$COOZ, wherein Z is an alkyl or aryl group;
R=—CH$_2$NC$_{12}$H$_8$ and R'=—CH$_2$NC$_{12}$H$_8$;
R=—(CH$_2$)$_2$OH and R'=—(CH$_2$)$_2$OH;
R=—(CH$_2$)$_3$OH and R'=—(CH$_2$)$_3$OH;
R=—(CH$_2$)$_8$COOCH$_3$ and R'=—(CH$_2$)$_8$COOCH$_3$;
R=—CH$_2$OH and R'=—CH$_3$;
R=—(CH$_2$)$_n$CH$_3$ and R'=—(CH$_2$)$_m$COOH, wherein 12<n<16, 1<m<10, and n and m are different integers; and
R=—(CH$_2$)$_n$CH$_3$ and R'=—(CH$_2$)$_m$COO—Li$^+$, wherein 12<n<16, 1<m<10 and n and m are different integers.

3. A method in accordance with claim 1 wherein the pressure applied is about 200 psi.

4. A method in accordance with claim 1 wherein the shorn molten monomer layer is crystallized by cooling the shorn molten monomer layer at a cooling rate less than or equal to about 0.1° C./minute while maintaining constant pressure on the monomer layer during cooling.

5. A method in accordance with claim 4 wherein the cooling rate is less than or equal to about 1° C./hour.

6. A method in accordance with claim 1 wherein the step of forming the molten monomer layer comprises melting crystals of the pure diacetylene monomer between the two opposed surfaces.

7. A method for preparing thin large-area single crystals of polydiacetylene comprising:

forming a liquid layer of pure molten diacetylene monomer represented by the formula

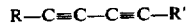

wherein R and R' are side groups selected such that the monomer is polymerizable by a 1,4-addition solid state reaction upon exposure to actinic radiation between two clean, parallel, flat, smooth, opposed surface, one surface being movable with respect to the other surface;

applying pressure of at least 5 psi to the molten monomer layer disposed between the two opposed surfaces;

shearing the molten monomer layer by sliding the movable surface in a single direction across the molten monomer layer, while keeping the molten monomer layer under constant pressure of at least 5 psi;

crystallizing the shorn molten monomer layer by cooling, while maintaining the constant pressure on the shorn molten monomer layer, to form a thin large-area single crystal of diacetylene monomer of predetermined growth direction; and exposing the thin large-area single crystal of diacetylene monomer to actinic radiation to form a thin large-area single crystal of polydiacetylene of a single predetermined growth direction;

wherein the steps of forming, applying pressure to, shearing, crystallizing, and polymerizing the molten monomer layer are all carried out in an inert atmosphere.

8. A method in accordance with claim 7 wherein R and R' are selected from the group of R and R' pairs consisting of R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'=—(CH$_2$)$_4$OCONHC$_6$H$_5$;
R=—(CH$_2$)$_4$OCONHC$_2$H$_5$ and R'=—(CH$_2$)$_4$OCONHC$_2$H$_5$;
R=(CH$_2$)$_4$OCONHCH(CH$_3$)$_2$ and R'=—(CH$_2$)$_4$OCONHCH(CH$_3$)$_2$; R=—(CH$_2$)$_n$OCONHCH$_2$COOZ and R'=—(CH$_2$)$_n$OCONHCH$_2$COOZ, wherein Z is an alkyl or aryl group;
R=—CH$_2$NC$_{12}$H$_8$ and R'=—CH$_2$NC$_{12}$H$_8$;
R=—(CH$_2$)$_2$OH and R'=—(CH$_2$)$_2$OH;
R=—(CH$_2$)$_3$OH and R'=—(CH$_2$)$_3$OH;
R=—(CH$_2$)$_8$COOCH$_3$ and R'=—(CH$_2$)$_8$COOCH$_3$;
R=—CH$_2$OH and R'=—CH$_3$;
R=—(CH$_2$)$_n$CH$_3$ and R'=—(CH$_2$)$_m$COOH, wherein 12<n<16, 1<m<10, and n and m are different integers; and
R=—(CH$_2$)$_n$CH$_3$ and R'=—(CH$_2$)$_m$COO—Li$^+$, wherein 12<n<16, 1<m<10, and n and m are different integers.

9. A method in accordance with claim 7 wherein the shorn molten layer is crystallized by cooling the shorn molten monomer layer at a cooling rate less than or equal to about 0.1° C./minute while maintaining constant pressure on the monomer layer during cooling.

10. A method in accordance with claim 9 wherein the cooling rate is less than or equal to about 1° C./hour.

11. A method in accordance with claim 9 wherein the cooling rate is less than or equal to about 0.5° C./hour.

12. A method in accordance with claim 7 wherein the step of forming the molten monomer layer comprises melting crystals of the pure diacetylene monomer between the two opposed surfaces.

* * * * *

UNITED STATES PATENT AND TRADEMARK OFFICE
CERTIFICATE OF CORRECTION

PATENT NO. : 4,698,121
DATED : October 6, 1987
INVENTOR(S) : Mrinal K. Thakur et al.

It is certified that error appears in the above—identified patent and that said Letters Patent is hereby corrected as shown below:

IN THE SPECIFICATION

Column 4, line 29, after "are", "difference" should read --different--;
lines 31-32, after "and" (second occurence) the second side group formula "$\underline{R} = -(CH_2)_m COO-Li^+$" should read --"$R' = -(CH_2)_m COO^- Li^+$"--;
line 38, after the numeral "100" should appear --microns.--.

IN THE CLAIMS

Claim 2, line 50, after "and", in the second R' side group, that portion of the formula reading "$-(CH_2)_m COO-$" should read -- $-(CH_2)_m COO^-$ --.

Claim 8, line 53, after "and", in the second R' side group, that portion of the formula reading "COO-" should read -- $COO^-$ --.

Signed and Sealed this

Fifth Day of July, 1988

Attest:

DONALD J. QUIGG

Attesting Officer        Commissioner of Patents and Trademarks